United States Patent [19]

Collins

[11] 4,177,453
[45] Dec. 4, 1979

[54] DIGITAL REMOTE CONTROL SYSTEM WITH IMPROVED NOISE IMMUNITY

[75] Inventor: Johnny Collins, Oak Park, Ill.

[73] Assignee: Zenith Radio Corporation, Glenview, Ill.

[21] Appl. No.: 845,191

[22] Filed: Oct. 25, 1977

[51] Int. Cl.$^2$ .............................................. H04Q 4/00
[52] U.S. Cl. ............................ 340/171 A; 340/171 R; 340/171 PF; 340/164 R; 340/168 B
[58] Field of Search ............ 340/171 R, 171 A, 168 R, 340/168 B, 171 PF, 164 R

[56] References Cited

U.S. PATENT DOCUMENTS

| | | | |
|---|---|---|---|
| 3,611,927 | 10/1971 | Kramer | 340/171 R |
| 3,855,575 | 12/1974 | Leuschner | 340/167 R |
| 3,980,956 | 9/1976 | Wooling | 340/171 X |
| 4,006,462 | 1/1977 | Podowski | 340/168 B |
| 4,010,423 | 3/1977 | Collins | 340/171 X |
| 4,021,741 | 5/1977 | Collins | 340/168 B |
| 4,023,105 | 5/1977 | Wooling | 340/168 R |
| 4,064,488 | 12/1977 | Chapman | 340/171 |

Primary Examiner—Harold I. Pitts

[57] ABSTRACT

A remote control receiver for selectively actuating a plurality of functions, each function uniquely corresponding to control signals lying in a respective band of frequencies. The function determining control signal is supplied to a digital counter which, during each of a continuous series of fixed duration timing intervals, develops an output count representative of the frequency of the received control signal. A portion of each count comprising the most significant bits thereof is processed for identifying the condition wherein the frequency of the received control signal lies in the same frequency band for successive timing intervals. The remaining portion of each count comprising the least significant bits thereof is processed for identifying the condition wherein a subsequent count is within a restricted range of counts centered about a prior count for successive timing intervals. Coincidence of the two conditions for a predetermined number of consecutive timing intervals results in actuation of the function corresponding to the frequency band for which the conditions were satisfied.

9 Claims, 10 Drawing Figures

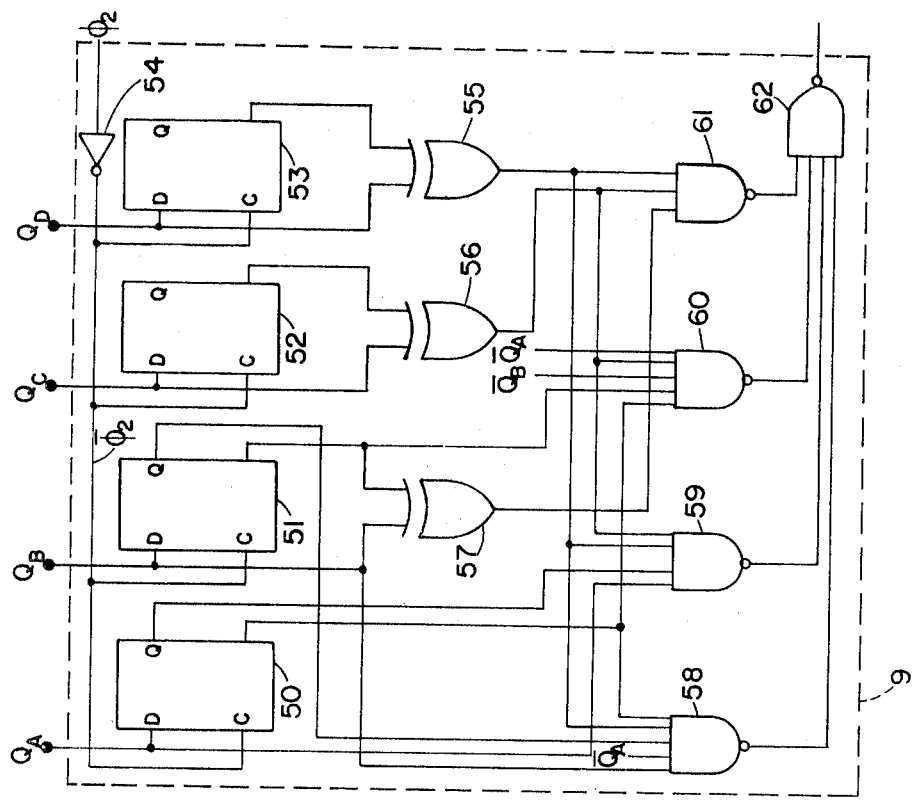
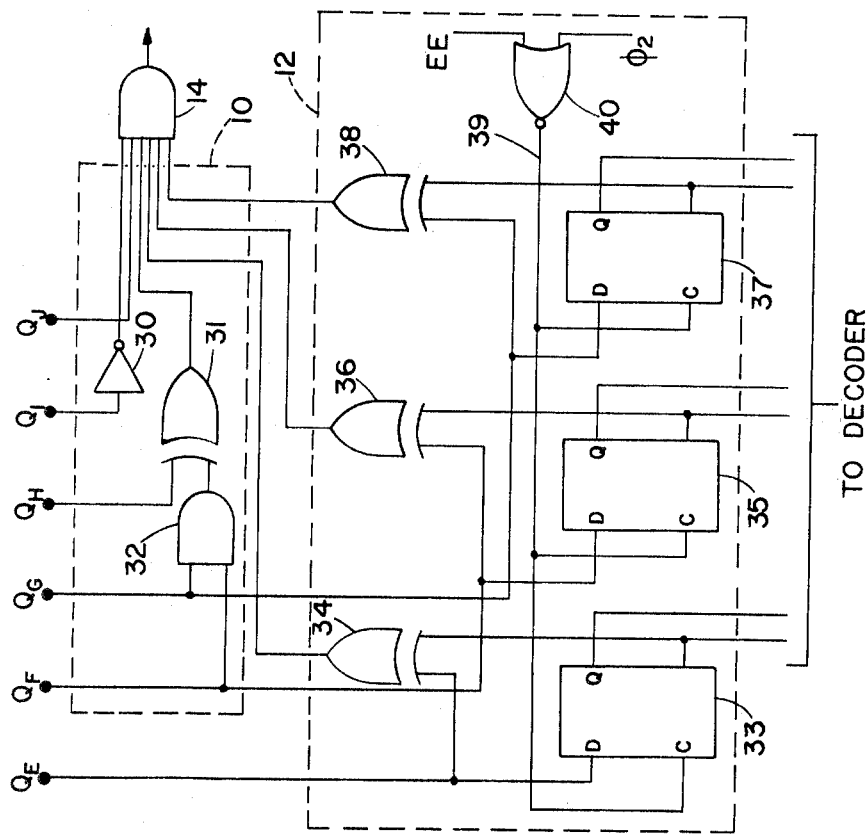
FIG. 3
FIG. 2

| FUNCTION | CONTROL FREQUENCY | PULSES COUNTED/16.6 ms | AUTHENTICATION CODE $Q_J Q_I Q_H$ | FUNCTION CODE $Q_G Q_F Q_E$ | PRESCALER STATE $Q_D Q_C Q_B Q_A$ |
|---|---|---|---|---|---|
| SPARE | 36,480 | 608 | 1 0 0 | 1 1 0 | 0 0 0 0 |
| | ⋮ | ⋮ | ⋮ | ⋮ | ⋮ |
| | 37,380 | 623 | 1 0 0 | 1 1 0 | 1 0 0 0 |
| MUTE | 37,440 | 624 | 1 0 0 | 1 1 1 | 0 0 0 0 |
| | 37,500 | 625 | 1 0 0 | 1 1 1 | 0 0 0 1 |
| | 37,560 | 626 | 1 0 0 | 1 1 1 | 0 0 1 1 |
| | 37,620 | 627 | 1 0 0 | 1 1 1 | 0 0 1 0 |
| | 37,680 | 628 | 1 0 0 | 1 1 1 | 0 1 1 0 |
| | 37,740 | 629 | 1 0 0 | 1 1 1 | 0 1 1 1 |
| | 37,800 | 630 | 1 0 0 | 1 1 1 | 0 1 0 1 |
| | 37,860 | 631 | 1 0 0 | 1 1 1 | 0 1 0 0 |
| | 37,920 | 632 | 1 0 0 | 1 1 1 | 1 1 0 0 |
| | 37,980 | 633 | 1 0 0 | 1 1 1 | 1 1 0 1 |
| | 38,040 | 634 | 1 0 0 | 1 1 1 | 1 1 1 1 |
| | 38,100 | 635 | 1 0 0 | 1 1 1 | 1 1 1 0 |
| | 38,160 | 636 | 1 0 0 | 1 1 1 | 1 0 1 0 |
| | 38,220 | 637 | 1 0 0 | 1 1 1 | 1 0 1 1 |
| | 38,280 | 638 | 1 0 0 | 1 1 1 | 1 0 0 1 |
| | 38,340 | 639 | 1 0 0 | 1 1 1 | 1 0 0 0 |
| VOLUME DOWN | 38,400 | 640 | 1 0 1 | 0 0 0 | 0 0 0 0 |
| | ⋮ | ⋮ | ⋮ | ⋮ | ⋮ |
| | 39,300 | 655 | 1 0 1 | 0 0 0 | 1 0 0 0 |
| POWER | 39,360 | 656 | 1 0 1 | 0 0 1 | 0 0 0 0 |
| | ⋮ | ⋮ | ⋮ | ⋮ | ⋮ |
| | 40,200 | 671 | 1 0 1 | 0 0 1 | 1 0 0 0 |
| CHANNEL DOWN | 40,320 | 672 | 1 0 1 | 0 1 0 | 0 0 0 0 |
| | ⋮ | ⋮ | ⋮ | ⋮ | ⋮ |
| | 41,220 | 687 | 1 0 1 | 0 1 0 | 1 0 0 0 |
| CHANNEL UP | 41,280 | 688 | 1 0 1 | 0 1 1 | 0 0 0 0 |
| | ⋮ | ⋮ | ⋮ | ⋮ | ⋮ |
| | 42,180 | 703 | 1 0 1 | 0 1 1 | 1 0 0 0 |
| VOLUME UP | 42,240 | 704 | 1 0 1 | 1 0 0 | 0 0 0 0 |
| | ⋮ | ⋮ | ⋮ | ⋮ | ⋮ |
| | 43,140 | 719 | 1 0 1 | 1 0 0 | 1 0 0 0 |
| SPARE | 43,200 | 720 | 1 0 1 | 1 0 1 | 0 0 0 0 |
| | ⋮ | ⋮ | ⋮ | ⋮ | ⋮ |
| | 44,100 | 735 | 1 0 1 | 1 0 1 | 1 0 0 0 |

FIG. 10

DIGITAL REMOTE CONTROL SYSTEM WITH IMPROVED NOISE IMMUNITY

BACKGROUND OF THE INVENTION

The invention relates to remote control systems responsive to transmitted control signals for selectively performing a plurality of independent functions. More particularly, the invention relates to remote control systems of the foregoing type having improved noise immunity means to enable the system to distinguish between intentionally generated control signals and spurious signals. While not to be so restricted, the invention will be discussed in terms of a remote control system for a television receiver.

Ultrasonic remote control systems have for years been a popular control medium for television receivers. A typical system consists of a viewer actuated transmitter for producing ultrasonic control signals at discrete frequencies and a remote receiver in the television set for receiving and decoding the control signals. The transmitter may be either electronic, and include an oscillator, or mechanical and employ rods of selected length and material which, when mechanically struck, produce distinctive ultrasonic frequencies corresponding to the selected function. A transducer in the remote receiver converts the transmitted ultrasonic information into corresponding electrical information which is supplied to a series of resonant circuits, each responsive to a particular control signal frequency. The resonant circuits thus determine which control signal has been received and activate appropriate utilization circuits to perform the selected function in the television receiver.

More recently, remote control receivers have been proposed wherein digital techniques are employed to count the cycles of an ultrasonic signal received during a predetermined timing interval for identifying the transmitted frequency and the corresponding function to be controlled. Exemplary of the foregoing are the systems disclosed in U.S. Pat. Nos. 3,855,575 to Leuschner et al and 3,611,297 to Kramer et al. In other recent remote control receivers each controlled function uniquely corresponds to a continuous band of transmitted frequencies. Decoding circuits, in response to a counter-derived control frequency, determine the frequency band in which the received signal lies and the corresponding function to be controlled. U.S. Pat. Nos. 3,980,956 and 4,023,105 to Woolling, Jr. and 4,006,462 to Podowski et al are exemplary of the latter type of system.

In the ultrasonic spectrum, noise produced, for example, by the jingling of keys or dropping of coins on hard surfaces may cause false actuation of individual functions of the television set by the remote receiver. Recognizing that control signals and noise are distinguishable on the basis of amplitude and duration, a common form of noise immunization uses RC networks for integrating the relatively long duration control signals. Noise or other short duration signals are generally incapable of actuating the utilization devices. Another form of noise immunization uses noise information to reverse bias the remote amplifier, and in effect, preclude operation of the system in the presence of noise. The previously mentioned Kramer patent employs a noise suppressor circuit which requires that a valid control signal have a constant amplitude for a fixed period of time. The noise suppressor prevents the counter from responding to noise related pulses thereby providing noise immunization. In a similar manner, the remote receiver disclosed in the Leuschner et al referred to above includes means whereby, when interfering noise is detected, the system is shut down to prevent counting of the noise related pulses.

As previously discussed, U.S. Pat. Nos. 3,980,956 and 4,006,462 disclose remote control systems wherein each controlled function corresponds to a continuous band of frequencies. In these systems, a digital counter is used to repetitively derive the frequency of a transmitted control signal during each of a series of timing intervals. The determination that a derived frequency falls within one of the frequency bands presumptively indicates that the viewer has selected the corresponding controlled function for actuation. Noise immunity is achieved by requiring that, before a controlled function is actuated, the derived frequency fall within the same frequency band for a predetermined number of timing intervals. While further noise immunity may be achieved by reducing the bandwidth of the controlled function related frequency bands, the increased selectivity of the resulting narrowband system would not be compatible with the frequency tolerances to be expected in an ultrasonic transmitter intended for use in the consumer electronics market. For example, in addition to frequency deviations resulting from manufacturing tolerances, it is not uncommon for the frequency of an ultrasonic transmitter to drift substantially with age. Moreover, slight physical movements of the transmitter by the viewer can result in frequency deviations of the transmitted control signals. A highly selective narrowband system would be incapable of accommodating these factors and would lead to decreased reliability of positive function selection by the viewer. Thus, although a narrow bandwidth system is desirable from a noise immunity viewpoint, a broadband system on the other hand allows for increased system reliability by more effectively accommodating normal frequency deviations. The present invention resolves these apparently conflicting design considerations by providing a remote control receiver advantageously combining the selectivity characteristics of a broadband system with the improved noise immunity of a narrowband system.

SUMMARY OF THE INVENTION

An object of the present invention is to provide a novel remote control system.

More specifically, it is an object of the present invention to provide an improved remote control system having enhanced noise immunity.

In accordance with the invention a remote control receiver is operable in response to transmitted control signals for selectively actuating a plurality of controllable functions. Each function is identified by control signals lying in a respective band of frequencies. The remote control receiver includes means for deriving the frequency of a received control signal during each of a series of consecutive timing intervals. The frequency derived during each timing interval is compared to the frequency derived during the immediately preceding timing interval to identify the condition wherein the later derived frequency is within a relatively narrow adaptive sub-band of frequencies centered about the earlier derived frequency, the narrow sub-band being entirely included within one of the function determining frequency bands. Means responsive to the foregoing comparison actuate the corresponding function upon continued existence of the condition for a predetermined number of timing intervals. Since, for any particular comparison, the earlier derived frequency may validly occur anywhere within the broader function determining band, the system of the invention advantageously combines the characteristics of broadband signal selectivity with narrowband noise immunity.

BRIEF DESCRIPTION OF THE DRAWINGS

FIG. 2 is a logic diagram showing embodiments of the authentication logic and function logic blocks generally illustrated in FIG. 1.

FIG. 3 is a logic diagram depicting an embodiment of the window logic block generally illustrated in FIG. 1.

FIG. 10 is a chart illustrating the functions, the corresponding frequencies and the related binary digits to which the system of the invention is responsive.

DESCRIPTION OF THE PREFERRED EMBODIMENT

Figure 1:
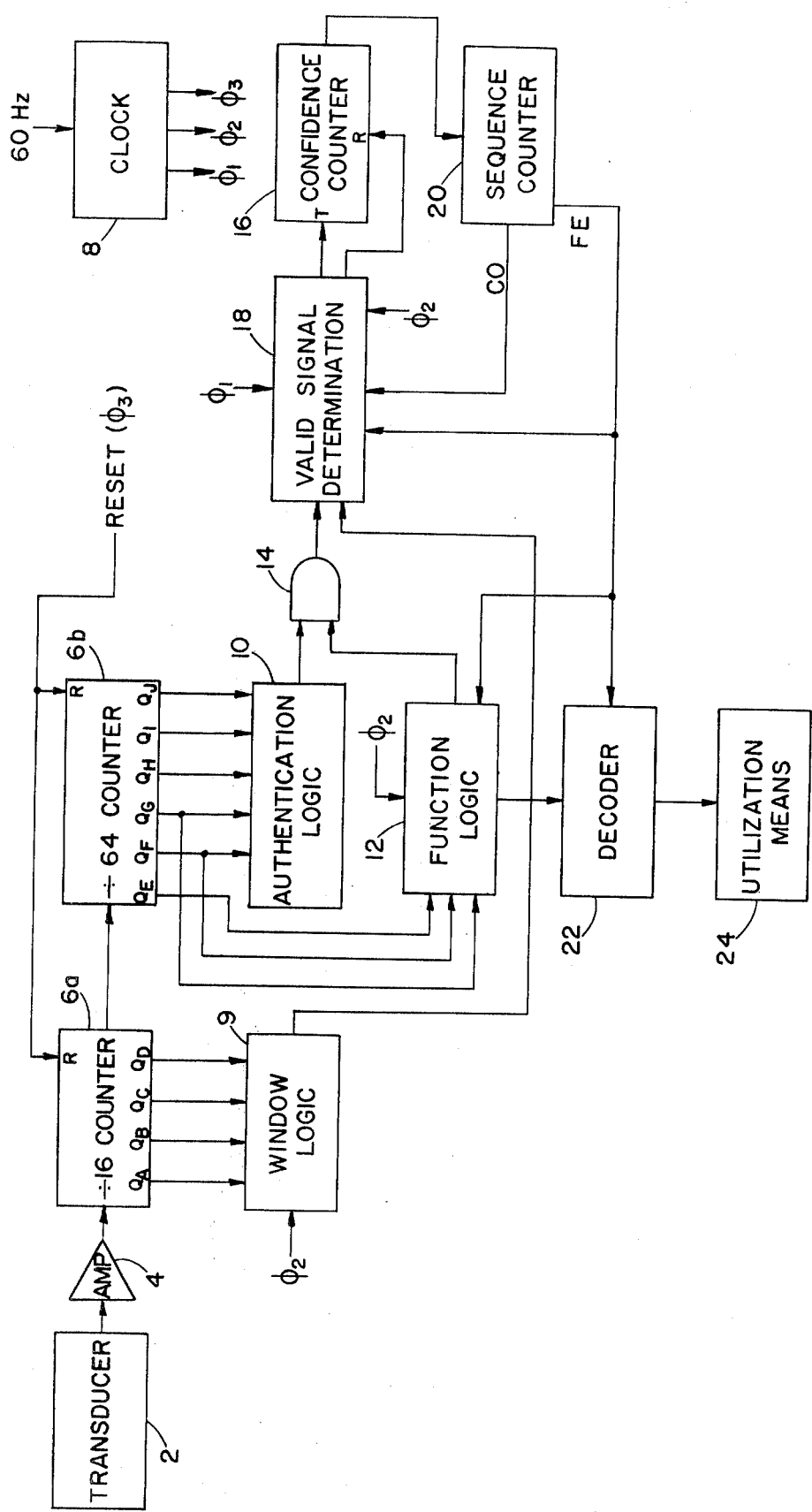
FIG. 1 is a block diagram generally illustrating the system of the present invention.

The system of FIG. 1 is responsive to a viewer operated multi-frequency ultrasonic transmitter (not shown) for controlling various functions of a television receiver according to the frequency of a transmitted control signal. Typical control frequencies are in the range of 35,000 Hz to 45,000 Hz and grouped within this band into function identifying sub-bands of 960 Hz (see FIG. 10). Each 960 Hz function identifying sub-band uniquely corresponds to a particular controllable function of the television receiver. Thus, for example, the transmission of a control signal having a frequency included within the range 37,440 Hz-38,340 Hz is intended to operate the "MUTE" function of the receiver and so on. This frequency band approach for identifying controllable functions is used for accommodating transmitter frequency deviations which may arise from various well known sources.

Figure 7:
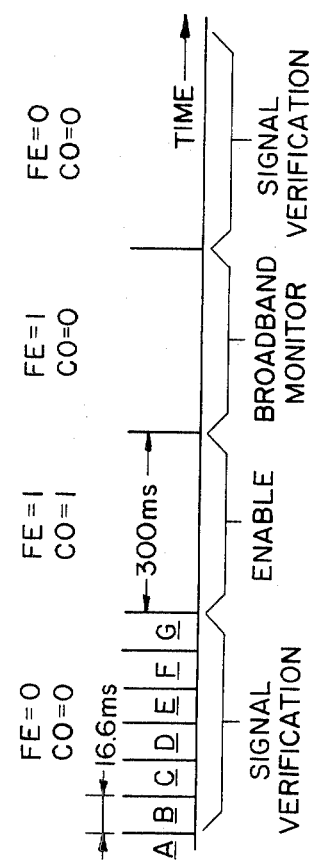
FIG. 7 is a chart depicting the timing signals developed by the clock shown in FIG. 1.

Referring now to FIG. 1 for a general description of the invention, transmitted ultrasonic control signals are received by a transducer 2 and converted thereby into corresponding electrical signals of the same frequency. The electrical signals are, in turn, coupled through a broadband amplifier 4 to a ten stage binary counter consisting of an input counter 6a and an output counter 6b. Counters 6a and 6b, which preferably comprise a four stage synchronously operated Gray code counter and a six stage Ripple counter respectively, sample, under the control of reset pulses $\phi_3$ supplied by a clock 8, the incoming signal to repetitively determine its frequency in the form of binary digits developed on a series of outputs $Q_J$–$Q_A$. The timing waveforms including $\phi_3$ generated by clock 8 are shown in FIG. 7. The count developed on outputs $Q_J$–$Q_A$ during each timing interval (i.e., the derived frequency) is coupled to a series of decoding and signal verification circuits for enabling performance of the television associated function corresponding to the transmitted frequency. To simplify the following discussion, the terms $Q_J$–$Q_A$ will hereinafter be alternately used to identify both the outputs of counters 6a and 6b as well as the binary bits developed thereon during each timing interval. Circuitry substantially similar to much of the foregoing decoding and signal verification circuits is fully disclosed in U.S. Pat. Nos. 4,006,462 to Podowski et al and 4,010,423 and 4,021,741 to Collins et al. In this regard, the present invention essentially comprises the inclusion of a window logic circuit 9 within the signal verification system of these references.

Referring again to FIG. 1, it will be noted that the five most significant bits $Q_J$–$Q_F$ of the output count are coupled to an authentication logic circuit 10 while bits $Q_G$–$Q_E$ are coupled to a function logic circuit 12. Authentication logic 10 supplies a 1 level output to an AND gate 14 whenever the output count represents a transmitted frequency falling within the overall bandwidth of the system. On the other hand, function logic 12, in response to $\phi_2$ clock signals from clock 8 and a 0 level enabling signal on line FE, supplies a 1 level signal to the remaining input of AND gate 14 whenever a transmitted frequency occurs in the same functional sub-band for two successive counting intervals. Thus, an output count representing the condition wherein a transmitted frequency occurs within the overall bandwidth of the system and within the same functional sub-band as the frequency transmitted during the immediately preceding timing interval, results in a 1 level signal being coupled from the output of AND gate 14 to one input of a valid signal determination circuit 18.

Another input to valid signal determination circuit 18 is supplied from window logic circuit 9 in response to clock signal $\phi_2$ and the four least significant bits $Q_D$–$Q_A$ of the output count. Window logic circuit 9 in effect creates a relatively narrow "floating window" within a functional sub-band within which a transmitted signal must occur during successive timing intervals before the signal will be verified as being valid by the system. More specifically, window logic circuit 9 couples a 1 level signal to valid signal determination circuit 18 whenever the current count represented by bits $Q_D$–$Q_A$ occurs within a narrowly restricted range of values centered about the count corresponding to bits $Q_D$–$Q_A$ developed during the immediately preceding timing interval. In terms of frequency, this restricted range is preferably ⅛ of a functional sub-band or 120 Hz. It will be observed that, since the restricted range is, during each timing interval, defined according to the signal frequency actually received during the immediately preceding timing interval, the frequency window defined thereby is free to incrementally shift or float within a functional sub-band.

Valid signal determination circuit 18 increments a confidence counter 16 in response to clock signal $\phi_1$ and in response to level signals supplied from AND gate 14 and window logic circuit 9. Therefore, confidence counter 16 is incrementally advanced each timing interval during which a received control signal is characterized by a frequency satisfying the logical constraints established by authentication logic circuit 10, function logic circuit 12 and window logic circuit 9. Should any of the three foregoing constraints not be satisfied during a given timing interval, valid signal determination circuit 18 operates to reset confidence counter 16 to its original state. However, in response to continued advancement by valid signal determination circuit 18 for a predetermined number of successive timing intervals, confidence counter 16 is operable for activating a sequence counter 20 coupled to the output thereof. Upon activation, sequence counter output CO (carry-on) disables valid signal determination circuit 18 and output FE (function enable) latches function logic circuit 12, enables a decoder circuit 22 and renders valid signal determination circuit 18 unresponsive to outputs from window logic circuit 9. Output CO maintains valid signal determination circuit 18 disabled for a predetermined timing interval (300 ms in the preferred embodiment of the invention) during which output FE also maintains decoder 22 enabled, function logic circuit 12 latched and valid signal determination circuit 18 unresponsive to window logic circuit 9. During the 300 ms timing interval, enabled decoder 22 decodes the latched state of function logic circuit 12, corresponding to bits $Q_E$, $Q_F$ and $Q_G$, and supplies an appropriate signal to a plurality of utilization means 24 for activating the selected control function.

Upon termination of the 300 ms timing interval, sequence counter output CO re-enables valid signal determination circuit 18 rendering its responsive only to outputs from AND gate 14. The condition representing the detection of an invalid signal, particularly key release, by authentication logic circuit 10 and function logic circuit 12 (i.e., a received control signal not occurring in the selected functional sub-band) is coupled by AND gate 14 to valid signal determination circuit 18 for resetting confidence counter 16 and sequence counter 20. The system is now re-established in its original condition for monitoring subsequently transmitted control signals.

The remote control receiver as generally described above thus includes several features co-acting to provide increased noise immunity. Initially, window logic circuit 9, authentication logic 10 function logic 12 collectively require that a transmitted control signal occur within a narrowly defined adaptive window for two successive timing intervals. The selectivity of the system is not substantially increased, however, since the adaptive window may initially occupy any position within a 960 Hz functional sub-band. Next, confidence counter 16 provides further assurance of proper signal recognition by requiring repetitive satisfaction of the latter condition for a predetermined number of successive timing intervals. Finally, sequence counter 20 renders the system unresponsive to temporary interruptions of the control signal after the establishment of a valid state by disabling valid signal determination circuit 18 for a predetermined interval.

Continuing in greater detail, the functional elements depicted in FIG. 1 will now be described with reference to the chart of FIG. 10. FIG. 10 illustrates the relationship between the various control frequencies and the controllable functions, the number of pulses counted during a timing interval and the corresponding state of outputs $Q_J-Q_A$ of counters 6a and 6b. It will be observed that the overall bandwidth of the system includes frequencies between 36,480 Hz and 44,100 Hz corresponding to counts of between 608 to 735 during each timing interval. The counts are shown in binary notation as the outputs $Q_J-Q_A$ of counters 6a and 6b. In the preferred embodiment of the invention, the timing or counting interval is 16.6 ms as established by reset pulses $\phi_3$ applied to the counters by clock 8. It will further be noted that the control frequencies are subdivided into a number of 960 Hz function related subbands. For example, control frequencies between 37,440 Hz and 38,340 Hz identify the MUTE function. And, by way of further example, within the MUTE function the control frequency 37,860 Hz corresponds to a decimal count of 631 wherein outputs $Q_J-Q_A$ exhibit the state 1001110100.

Referring now to FIG. 2, authentication logic 10 comprises means connected for decoding the higher order bits $Q_J-Q_F$, referred to herein as the authentication code, of the output count $Q_J-Q_A$ to determine whether a transmitted control signal is within the overall system bandpass. Recognizing that a control signal having a frequency within the overall bandpass of the system results in an output count $Q_J-Q_A$ of either 10011XXXXX, 1010XXXXXX, or 10110XXXXX (where X can be either 0 or 1), authentication logic 10 consists of circuitry for suitably decoding these three states. Accordingly, output $Q_I$ of counter 6b is coupled through an inverter 30 to a first input of AND gate 14 while output $Q_J$ is directly coupled to a second input of the AND gate. A third input to AND gate 14 is supplied from the output of an EXCLUSIVE OR gate 31 whose inputs are coupled to output $Q_H$ and the output of an AND gate 32. The inputs of AND gate 32 are, in turn, coupled to outputs $Q_F$ and $Q_G$. To illustrate the operation of authentication logic 10, assume the transmission of a control signal having a frequency corresponding to selection of the MUTE functions. In this case the outputs $Q_J-Q_A$ of counters 6a and 6b will read 10011XXXX. The logical 1 signal at output $Q_J$ is coupled directly to the second input of AND gate 14 while the logical 0 signal at output $Q_I$ is inverted by inverter 30 and coupled to the first input of AND gate 14 as a logical 1 level signal. Since both outputs $Q_F$ and $Q_G$ are logical 1, the output of AND gate 32 is logical 1. The logical 1 level signal at the output of AND gate 32 and the logical 0 signal at output $Q_H$ cause EXCLUSIVE OR gate 31 to couple a logical 1 signal to the third input of AND gate 14. Therefore, since the first three inputs of AND gate 14 are all logical 1, the control signal is decoded as being within the overall system band pass.

Function logic 12 is arranged for decoding and storing the lesser order bits consisting of outputs $Q_G-Q_E$, referred to herein as the function code. In this regard, it should be noticed that each controllable function is uniquely identified by a particular function code. Referring again to FIG. 2, the first output $Q_E$ of the function code is connected to the D input of a flip-flop 33 and to one input of an EXCLUSIVE OR gate 34. Similarly, outputs $Q_F$ and $Q_G$ are connected to the D inputs of flip-flops 35 and 37 respectively and to first inputs of EXCLUSIVE OR gates 36 and 38. The remaining inputs of EXCLUSIVE OR gates 34, 36 and 38 are supplied from the $\overline{Q}$ outputs of flip-flops 33, 35 and 37 respectively, the Q and $\overline{Q}$ outputs of the flip-flops comprising the output of function logic 12 coupled to decoder 22. Finally, clock signals $\phi_2$ and signal FE are coupled through a NOR gate 40 to the C inputs of flip-flops 33, 35 and 37 over a line 39.

Operation of function logic 12 is as follows. At the end of a given timing interval the function code bits $Q_G$, $Q_F$ and $Q_E$ are stored in flip-flops 33, 35 and 37 repectively in response to the negative transition of clock pulse $\phi_2$. Shortly thereafter counters 6a and 6b are reset by the positive transition of clock pulse $\phi_3$. Assuming, for purposes of illustration, that the function code stored by the flip-flops is 111, the $\overline{Q}$ outputs of flip-flops 33, 35 and 37 coupled to the inputs of EXCLUSIVE OR gates, 34, 36 and 38 are all 0. These 0 level inputs are then compared on a bit by bit basis by the EXCLUSIVE OR gates with the function code developed by the counters during the following timing interval. For example, assuming the generation of a second 111 function code, the output of EXCLUSIVE OR gates 34, 36 and 38 are all 1 and, depending upon the state of authentication logic 10, the output of AND gate 14 is 1 indicating that two identical and valid function codes have been received during successive timing intervals. This comparison process continues in a similar fashion for all subsequent timing intervals. Note, however, that should a non-equality condition arise in the bits of the function code, at least one of the outputs of EXCLUSIVE OR gates, 34, 36 and 38 will assume a logical 0 condition. Accordingly, the output of AND gate 14 will be logical 0 indicating that the logical constraint established by function logic 12 has not been satisfied.

Referring to FIG. 3, window logic 9 constitutes circuitry for storing the least significant bits $Q_D$-$Q_A$, hereinafter referred to as the prescaler state, of the output count during each 16.6 ms timing interval and for comparing the stored information with the prescaler state generated during the immediately succeeding timing interval. A transmitted control signal is accepted as valid if it is within one count of the previous prescaler state or, in other words, within and adaptive 120 Hz window centered about the previous prescaler state.

More specifically, window logic 9 comprises a quadruplet of flip-flops 50, 51, 52 and 53, each of the flip-flops having its D input connected for receiving one bit of the prescaler state $Q_D$-$Q_A$. Flip-flops 50-53 are synchronously clocked in response to the negative transition of clock signal $\phi_2$ which is coupled through inverter 54 to the C inputs of the flip-flops. Prescaler bit $Q_D$ and the $\overline{Q}$ output of flip-flop 53 are coupled to an EXCLUSIVE OR gate 55 whose output, in turn, supplies a series of NAND gates 58, 59 and 61. A second EXCLUSIVE OR gate 56 has inputs for receiving prescaler bit $Q_C$ and the $\overline{Q}$ output of flip-flop 52 and an output connected to the input of a NAND gate 60 and to the inputs of NAND gates 59 and 61. A final EXCLUSIVE OR gate 57 has its output coupled to the remaining input of NAND gate 61 and its inputs connected for receiving prescaler bit $Q_B$ and the $\overline{Q}$ output of flip-flop 51. The remaining inputs to NAND gate 60 comprise the $\overline{Q}$ outputs of flip-flops 51 and 50 and the compliments of prescaler bits $Q_A$ and $Q_B$. The two remaining inputs to NAND gate 59 consists of prescaler bit $Q_A$ and the Q output of flip-flop 50. NAND gate 58 has its remaining inputs connected for receiving prescaler bit $Q_B$ and the compliment of $Q_A$ as well as the $\overline{Q}$ output of flip-flop 50 and the Q output of flip-flop 51. Finally, the outputs of NAND gates 58, 59, 60 and 61 are coupled to a NAND gate 62 whose output comprises the output of window logic 9.

Assuming, again for purposes of illustration, that the MUTE function has been selected and that the control signal frequency during the previous timing interval was 38,040 Hz, it will be observed that the prescaler state stored in flip-flops 50-53 is 1111. If, during the present timing interval, the frequency of the control signal is within a 120 Hz band centered about 38,040 Hz or, stated otherwise, within plus or minus one count of prescaler state 1111, the output of NAND gate 62 will be at a logical 1 level. For example, assuming a present prescaler state of 1110, corresponding to a frequency of 38,100 Hz, it will be observed that the inputs to each of the EXCLUSIVE OR gates 55-57 consists of a 0 level signal and a 1 level signal. The outputs of the EXCLUSIVE OR gates are therefore all logical 1 forcing the output of NAND gate 61 to logical 0. The logical 0 level signal at the output of NAND gate 61, in turn, causes the output of NAND gate 62 to be logical 1 indicating compliance with the logical constraints of window logic 9. A similar comparison is performed during the next timing interval with the qualification that the 120 Hz window is now centered about the frequency 38,100 Hz rather than the original frequency of 38,040 Hz. If, during any timing interval, the derived prescaler state is not within plus or minus one count of the previously derived prescaler state, a 0 level signal appears at the output of NAND gate 62. For example, in the previous example assume that the frequency 38,160 Hz, corresponding to prescaler state 1010, immediately followed the original frequency of 38,040 Hz. Under these conditions, both inputs of EXCLUSIVE OR gate 56 are 0 resulting in a 0 level output. The 0 level output at EXCLUSIVE OR gate 56 forces the output of NAND gates 59, 60 and 61 to 1 and, since the output of NAND gate 58 is also 1, the output of NAND gate 62 is driven to 0 indicating an out of window control frequency.

With further reference to window logic 9, it will be appreciated that the prescaler state alone ambiguously defines any particular control frequency. That is, the 16 prescaler states shown in association with the MUTE function in the chart of FIG. 10 are identically repeated for the remaining control functions. As a result, the effect of window logic 9 is to introduce a series of 120 Hz windows centered about corresponding prescaler states in each of the 960 Hz functional sub-bands. This ambiguity does not, however, effect system operation since authentication logic 10 and function logic 12 restrict system responsiveness to a single functional sub-band.

Figure 4:
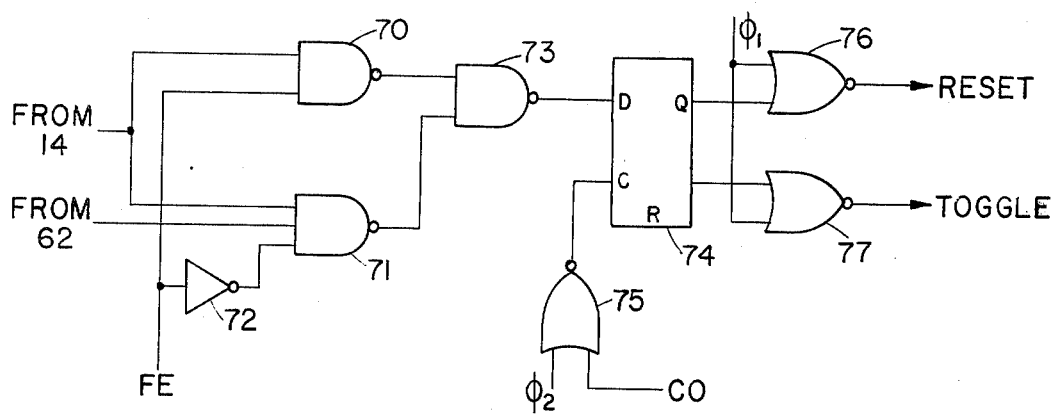
FIGS. 4, 5 and 6 are logic diagram illustrating embodiments of, respectively, the valid signal determination circuit, the confidence counter and the sequence counter shown in FIG. 1.

The outputs of window logic 9, authentication logic 10 and function logic 12 are coupled to valid signal determination circuit 18 (see FIG. 4) via a pair of input NAND gates 70 and 71. The output of NAND gate 62 of window logic 9 is coupled to a first input of NAND gate 71 while signal FE (to be described in further detail below) is coupled directly to a first input of NAND gate 70 and through an inverter 72 to a second input of NAND gate 71. A third input to NAND gate 71 is supplied from the output of AND gate 14 which also supplies a second input of NAND gate 70. The outputs of NAND gates 70 and 71 are coupled through a third NAND gate 73 to the D input of a flip-flop 74. Clock signal $\phi_2$ and signal CO (to be described in further detail hereinafter) are coupled through a NOR gate 75 to the C terminal of flip-flop 74. The Q output of flip-flop 74 supplies one input of a NOR gate 76 and the $\overline{Q}$ output supplies one input of a second NOR gate 77. The remaining inputs of NOR gates 76 and 77 are connected for receiving clock signal $\phi_1$.

In operation, signals FE and CO are 0 during the initial signal verification mode of operation of the system. Assuming satisfaction of the logical conditions imposed by window logic 9, authentication logic 10 and function logic 12 for successive timing intervals (1 level outputs from both NAND gate 62 and AND gate 14), the outputs of NAND gates 70 and 71 are 1 and 0 respectively. The resulting 1 level signal at the output of NAND gate 73 is stored by flip-flop 74 in response to clock pulse $\overline{\phi_2}$. The stored 1 level signal at the Q output of flip-flop 74 forces the output of NOR gate 76 to 0 whereas the 0 level signal at the $\overline{Q}$ output of flip-flop 74 will enable NOR gate 77 to couple $\phi_1$ pulses to its output. On the other hand, in response to either a 0 level output from NAND gate 62 or AND gate 14, denoting an invalid signal condition, the output of NAND gate 73 goes low whereby the output of NOR gate 77 goes low and NOR gate 76 couples $\phi_1$ pulses to its output. In certain modes of operation to be described below, signals FE and CO are driven to a logical 1 level. It will be observed that a logical 1 level CO signal disables valid signal determination circuit 18 by coupling a 0 level signal to the C input of flip-flop 74 and that a logical 1 level FE signal renders the circuit unresponsive to window logic 9 by coupling a 0 level signal to one input of NAND gate 71.

Figure 5:
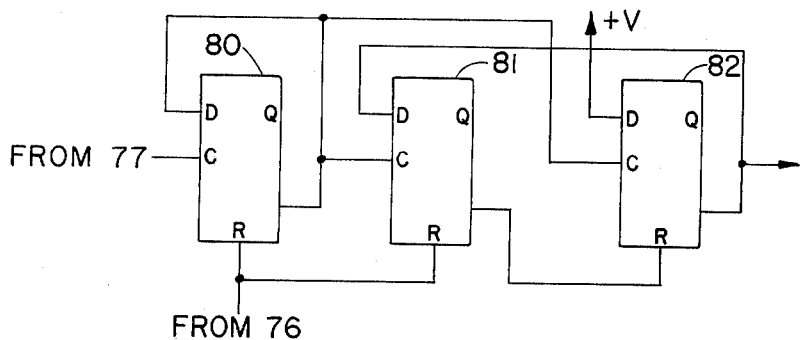

The output of NOR gates 76 and 77 of valid signal determination circuit 18 are coupled to confidence counter 16 (see FIG. 5) which consists of a series of three flip-flops 80, 81 and 82. The output of NOR gate 77 is coupled to the C terminal of input flip-flop 80 for toggling the confidence counter while the output of NOR gate 76 is connected for suitably resetting the confidence counter. Confidence counter 16 is therefore advanced by $\phi_1$ pulses coupled through NOR gate 77 as long as the Q output of flip-flop 74 is 1. Should the Q output of flip-flop 74 go low, the confidence counter is reset by a $\phi_1$ pulse coupled through NOR gate 76. Six consecutive incremental advances of confidence counter 16, corresponding to the satisfaction of logical conditions imposed by window logic 9, authentication logic 10 and function logic 12 for six consecutive timing intervals, establish confidence that the transmitted control signal is valid. The last transition of the six step counting sequence causes the Q output of flip-flop 82 to toggle sequence counter 20.

Figure 6:
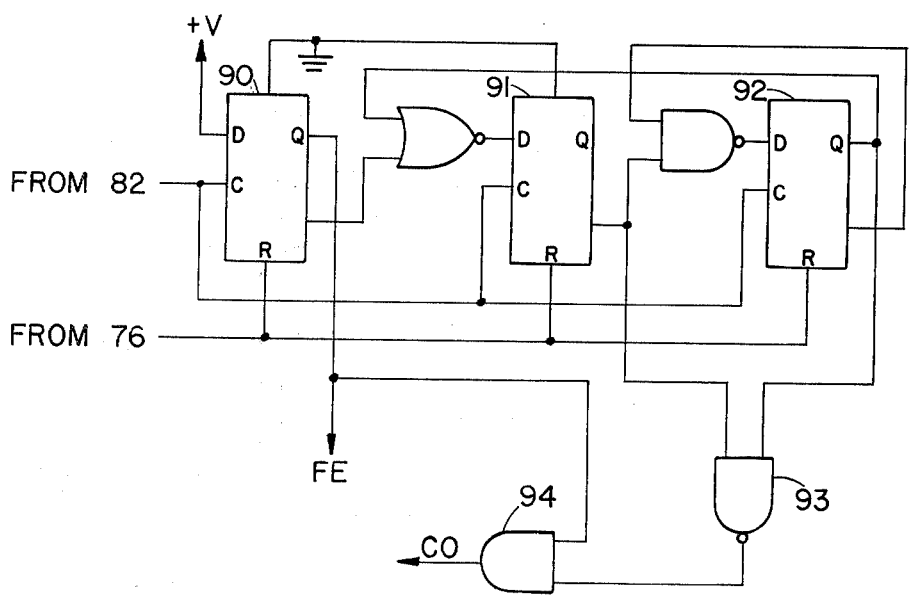

Referring to FIG. 6, sequence counter 20 comprises a triad of flip-flops 90, 91 and 92 interconnected for counting according to the sequence 0, 1, 3, 7, 5; state 5 being self-latching. The counting sequence is performed in response to the final transition of the confidence counter counting sequence represented by the Q output of flip-flop 82 which is coupled to the C inputs of flip-flops 90, 91 and 92. Accordingly, each complete counting sequence performed by confidence counter 16 results in the incremental advance of sequence counter 20. Moreover, since confidence counter 16 requires 100 ms to complete a full counting sequence (six 16.6 ms $\phi_1$ pulses), a full counting sequence is completed by sequence counter 20 in 300 ms. The Q output of flip-flop 90 comprises signal FE, signal CO being obtained by decoding the last state (state 5) of the sequence counter. This decoding function is accomplished by a NAND gate 93 having inputs coupled to the Q output of flip-flop 92 and the Q output of flip-flop 91. The output of NAND gate 93 is coupled to one input of an AND gate 94 whose other input is supplied from the Q output of flip-flop 90. The output of AND gate comprises signal CO.

It will be observed that in response to the initial clocking of sequence counter 20, a 1 level signal is read into flip-flop 90 from a source of positive potential +V, the state of the sequence counter (ie, of flip-flops 92, 91, 90) constituting 001. Signal FE is therefore at a logical 1 level and simultaneously latches the state of function logic 12 and renders valid signal determination circuit 18 unresponsive to outputs from window logic NAND gate 62. Signal CO is also at a logical 1 level and, in conjunction with NOR gate 75, disables valid signal determination circuit 18 wherein flip-flop 74 is latched with its Q output at 1. Under these conditions, NOR gate 77 couples $\phi_1$ clock pulses to confidence counter 16 without regard to and wholly independent of the control signals being received by the system. Continued coupling of $\phi_1$ clock pulses to confidence counter 16 results in sequence counter 20 transitioning through the states 011 and 111 to its self-latching state 101. As previously mentioned, a timing interval of 300 ms is required for sequence counter 20 to transition to state 101. During the 300 ms timing interval both signals FE and CO remain at a logical 1 level. The self-latched state 101 is decoded by gates 93 and 94 causing signal CO to go low thereby re-enabling valid signal determination circuit 18. However, since signal FE remains at a logical 1 level, valid signal determination circuit 18 is responsive only to the logical conditions imposed by authentication logic 10 and function logic 12. Upon the detection of an invalid signal by authentication logic 10 and function logic 12 (a control signal having a frequency falling within two different functional sub-bands during successive 16.6 ms timing intervals), a $\phi_1$ clock pulse is coupled through NOR gate 76 resetting confidence counter 16 and sequence counter 20 to states 000. The resetting operation causes signal FE to go low whereby the system is re-established in its initial state prepared to process another control signal input. It will, of course, be appreciated that while signal FE is at a 1 level, decoder 22 is enabled for decoding the state of function logic 12 and activating the corresponding television related function.

Figure 9:
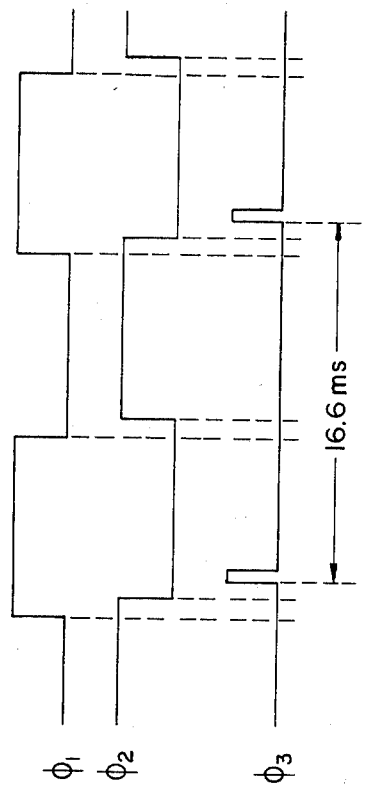
FIGS. 8 and 9 are charts useful in illustrating the operational sequence of the system of the present invention.
Figure 8:
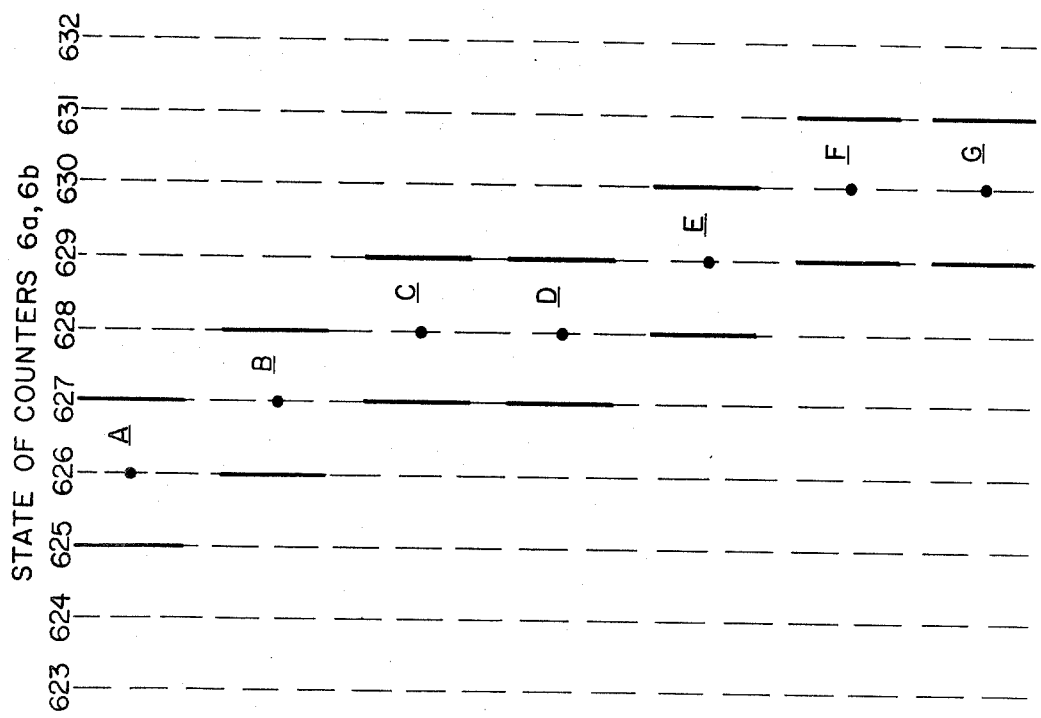

To aid in understanding the invention reference is made to the charts of FIGS. 8 and 9 which diagrammatically depict a complete sequence in the operation of the system. Assuming that the viewer has selected the MUTE function, the frequency of the transmitted control signal during a first 16.6 ms timing interval A corresponds to a count of 626. The logical conditions imposed by window logic 9, authentication logic 10 and function logic 12 prescribe a ±1 count (120 Hz) window centered about count 626 within which the count derived during the next 16.6 ms timing interval B must fall. As shown in FIG. 8, the count derived during time interval B is 627 satisfying the aforementioned condition. As a result, valid signal determination circuit 18 couples one $\phi_1$ clock pulse for advancing confidence counter 16 by one state. A new 120 Hz window within which the count derived during the following timing interval C must fall is now established about the frequency corresponding to count 627 developed during timing interval B. Since the count 628 developed during timing interval C falls within this window another $\phi_1$ pulse is coupled to confidence counter 16. As will be evident from an examination of FIG. 8, the counts derived during the remaining timing intervals D, E, F and G similarly satisfy the imposed logical conditions and result in the incremental advance of confidence counter 16. In particular, it will be noted that the narrow 120 Hz window is adaptive in nature in that it is free to "float" within a 960 Hz functional sub-band, its position being determined by the count derived during the previous timing interval. Of course, should the count derived during a particular timing interval fall outside the bounds of its associated 120 Hz window, a $\phi_1$ pulse is coupled through valid signal determination circuit 18 for resetting confidence counter 16. Such would be the case, for example, if a count of 630 was developed in response to timing interval D.

Upon the completion of timing interval G, i.e. following six successive "in-window" counts, confidence counter 16 toggles sequence counter 20 whereby signals FE and CO go logically high disabling valid signal determination circuit 18, latching function logic 12 and enabling decoder 22 for a period of 300 ms. Decoder 22 decodes the latched state of function logic 12 and activates the corresponding function. Following the 300 ms timing interval, signal CO goes low re-enabling valid signal determination circuit 18. However, since signal FE remains high, valid signal determination circuit 18 is responsive only to authentication logic 10 and function logic 12 for monitoring successive counts occurring within the latched functional sub-band. Finally, as soon as an invalid signal is received, i.e. a signal having a frequency not falling within the latched functional sub-band, a $\phi_1$ clock pulse resets confidence counter 16 and sequence counter 20 wherein the system is returned to its initial signal verification mode of operation.

What has been shown is a remote control receiver advantageously combining the selectivity characteristics of a broadband system with the improved noise immunity of a narrow band system. Broadband selectivity is achieved by initially accepting as valid any signal received within a relatively broad function related band of frequencies. Within a particular functional sub-band, narrow band noise immunity is facilitated through the use of an adaptive window which is free, within certain constraints, to migrate within the functional sub-band.

While particular embodiments of the invention have been shown and described, it will be obvious to those skilled in the art that changes and modifications may be made thereto without departing from the invention in its broader aspects and, therefore, the aim in the appended claims is to cover all such changes and modifications as fall within the true spirit and scope of the invention.

What is claimed is:

1. In a remote control receiver for selectively enabling a plurality of functions, each function corresponding to transmitted signals lying in a respective frequency band, the combination comprising:
   means for defining a plurality of consecutive timing intervals;
   means for repetitively deriving the frequency of a transmitted signal during each of said timing intervals;
   means for identifying the condition wherein a derived frequency is within a restricted range of frequencies included within one of said frequency bands and centered about the frequency derived during the immediately preceding one of said timing intervals; and
   means for enabling the function corresponding to said one frequency band in response to continued satisfaction of said condition for a predetermined number of successive ones of said timing intervals.

2. A remote control receiver according to claim 1 wherein said means for identifying comprises:
   first means for identifying a first condition wherein said derived frequency is within said one frequency band;
   second means for identifying a second condition wherein said derived frequency is within one of a plurality of said restricted frequency ranges offset from each other by the bandwidth of one of said frequency bands; and
   means detecting coincidence of said first and second conditions for identifying said condition.

3. A remote control receiver according to claim 2 wherein:
   said means for defining comprises a source of timing reference signals recurring at predetermined time intervals; and
   said means for deriving comprises counter means responsive to said timing reference signals and to said transmitted signals for providing binary output signals during each of said timing intervals representing an accumulated count in terms of a least significant grouping of binary bits and a most significant grouping of binary bits, said most significant grouping including information identifying said frequency bands.

4. A remote control receiver according to claim 3 wherein said second means comprises means for comparing successive ones of said least significant groupings of binary bits for satisfaction of a predetermined comparison criteria for identifying said second condition.

5. A remote control receiver according to claim 4 wherein said means for comparing comprises binary storage means and comparator means connected for comparing the counts corresponding to said successive least significant groupings for identifying said second condition in response to the subsequent of said successive counts being within a predetermined range of counts centered about the prior of said successive counts.

6. A remote control receiver according to claim 5 wherein said binary storage means and said comparator means are configured for prescribing said predetermined range of counts such that said restricted range of frequencies has a bandwidth ⅛ the bandwidth of one of said frequency bands.

7. In a remote control receiver for selectively enabling a plurality of functions, each of said functions corresponding to transmitted signals lying in a respective frequency band, the combination comprising:
   means for deriving the frequency of a transmitted signal during each of a plurality of timing intervals;
   means for repetitively defining a restricted range of frequencies centered about each of said derived frequencies; and
   means for enabling a selected one of said functions in response to a predetermined number of successive ones of said restricted frequency ranges exhibiting a predetermined relationship.

8. A remote control receiver according to claim 7 wherein said means for defining defines said restricted frequency ranges as having equal bandwidths substantially smaller than the bandwidth of said frequency bands.

9. A remote control receiver according to claim 8 wherein said means for enabling comprises means for enabling a selected one of said functions in response to a derived frequency falling within the restricted frequency range defined during the immediately preceding one of said timing intervals and contained within the frequency band corresponding to said selected function for said predetermined number of successive timing intervals.

* * * * *